US006396119B1

(12) United States Patent
Givens

(10) Patent No.: US 6,396,119 B1
(45) Date of Patent: May 28, 2002

(54) REDUCED RC DELAY BETWEEN ADJACENT SUBSTRATE WIRING LINES

(75) Inventor: John H. Givens, Meridan, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/515,519

(22) Filed: Feb. 29, 2000

Related U.S. Application Data

(60) Continuation of application No. 09/207,890, filed on Dec. 8, 1998, now Pat. No. 6,309,946, which is a continuation of application No. 08/723,263, filed on Sep. 30, 1996, now Pat. No. 5,835,987, which is a division of application No. 08/550,916, filed on Oct. 31, 1995, now abandoned.

(51) Int. Cl.⁷ .................. H01L 23/52; H01L 23/528
(52) U.S. Cl. .................. 257/522; 257/758; 438/631; 438/668
(58) Field of Search .................. 257/522, 638, 257/758; 438/631, 668

(56) References Cited

U.S. PATENT DOCUMENTS

| | | | |
|---|---|---|---|
| 3,978,269 A | 8/1976 | Martin | 428/403 |
| 4,039,480 A | 8/1977 | Watson et al. | 252/455 |
| 4,141,055 A | 2/1979 | Berry et al. | 361/410 |
| 4,450,184 A | 5/1984 | Longo et al. | 427/34 |
| 4,781,968 A | 11/1988 | Kellerman | 428/209 |
| 4,917,857 A | 4/1990 | Jaeckel et al. | 419/9 |
| 5,126,192 A | 6/1992 | Chellis et al. | 428/323 |
| 5,192,715 A | 3/1993 | Sliwa, Jr. et al. | |
| 5,278,103 A * | 1/1994 | Mallon et al. | 438/632 |
| 5,310,700 A | 5/1994 | Lien et al. | |
| 5,372,969 A | 12/1994 | Moslehi | |
| 5,407,860 A | 4/1995 | Stoltz et al. | |
| 5,413,962 A | 5/1995 | Lur et al. | |
| 5,468,685 A | 11/1995 | Orisaks et al. | |
| 5,506,173 A | 4/1996 | Nishimoto | |
| 5,510,645 A | 4/1996 | Fitch et al. | 257/522 |
| 5,523,615 A | 6/1996 | Cho et al. | 257/632 |
| 5,559,055 A | 9/1996 | Chang et al. | |
| 5,599,745 A | 2/1997 | Reinberg | |
| 5,739,579 A * | 4/1998 | Chiang et al. | 257/635 |
| 5,776,828 A | 7/1998 | Givens | 438/631 |
| 5,814,888 A | 9/1998 | Nishioka et al. | 257/758 |
| 5,835,987 A | 11/1998 | Givens | 257/522 |
| 5,847,439 A | 12/1998 | Reinberg | 257/522 |
| 6,048,802 A | 4/2000 | Avanzino et al. | 438/763 |

OTHER PUBLICATIONS

Pawloski, "The Science and Engineering of Thermal Spray Coatings," p. 20, John Wiley and Sons, Jan. 1995 (Prior Art).
Wolf et al., "Silicon Processing for the VLSI Era", vol. 1: Process Technology, 1986, Lattice Press, pp. 520–523, 161–164, 168 and 171, No month.
Ohkura et al., "A Novel Global Planarization Process Using Gap Filled With Self–Aligned Silica Spacer," VMIC Conference, Jun. 27–29, 1995 (1995 ISMIC—104/95/0233).
Bullet #ZPI–804 Insulating Bubbles Type IB–80 and IB–100; 7/96.

* cited by examiner

*Primary Examiner*—Allan R. Wilson
(74) *Attorney, Agent, or Firm*—TraskBritt

(57) ABSTRACT

A void is defined between adjacent wiring lines to minimize RC coupling. The void has a low dielectric value approaching 1.0. For one approach, hollow silicon spheres define the void. The spheres are fabricated to a known inner diameter, wall thickness and outer diameter. The spheres are rigid enough to withstand the mechanical processes occurring during semiconductor fabrication. The spheres withstand elevated temperatures up to a prescribed temperature range. At or above a desired temperature, the sphere walls disintegrate leaving the void in place. For an alternative approach, adjacent wiring lines are "T-topped" (i.e., viewed cross-sectionally). Dielectric fill is deposited in the spacing between lines. As the dielectric material accumulates on the line and substrate walls, the T-tops grow toward each other. Eventually, the T-tops meet sealing off an internal void.

23 Claims, 6 Drawing Sheets

REDUCED RC DELAY BETWEEN ADJACENT SUBSTRATE WIRING LINES

CROSS REFERENCE TO RELATED APPLICATION

This application is a continuation of application Ser. No. 09/207,890, filed Dec. 8, 1998, now U.S. Pat. No. 6,309,946 B1, issued Oct. 30, 2001, which is continuation of application Ser. No. 08/723,263, filed Sep. 30, 1996, now U.S. Pat. No. 5,835,987, issued Nov. 10, 1998; which is a divisional of application Ser. No. 08/550,916, filed Oct. 31, 1995, abandoned.

BACKGROUND OF THE INVENTION

1. Field of the Invention

This invention relates to wiring line formation and inter-line fill processes for a semiconductor substrate, and more particularly, to inter-line fill processes for reducing RC delay between adjacent wiring lines.

2. State of the Art

Integrated circuit substrates include many different p-type and n-type doped regions. These regions are connected in specific configurations to define desired devices and circuits. Conductive paths are defined on the substrate to connect the various doped regions to form the many devices and circuits. These paths typically are referred to as wires, interconnects, metal stacks, or conductors. The term "wiring line" is used herein to refer to all such conductive paths.

As device and circuit densities increase due to advances in technology, it is desirable to decrease wiring line pitches and spacings. A wiring line has a length, a thickness and a width. The non-line area between adjacent lines is referred to as the line spacing. The width and spacing is conventionally referred to as the line pitch. The spacing can be between lines on the same plane of the substrate or between lines on adjacent planes. Conventional line spacing of approximately 1.0 micron is known. There is a desire, however, to decrease line spacing as IC device densities increase.

One of the challenges of semiconductor processes is to maintain electrically-independent wiring lines. Electrical coupling between adjacent lines is undesirable. Reliable, uncoupled signals carried along adjacent lines are needed for normal circuit operation. One of the coupling characteristics between adjacent lines is the RC delay ("RC coupling"). Zero delay is ideal. Minimal RC delays are desired. As the spacing between two adjacent lines decreases, the RC coupling tends to increase. One of the physical characteristics defining RC delay (other than spacing) is the dielectric value of the fill material in the spacing between adjacent lines. Currently, dielectric values of approximately 3.0 are common for 1.0 micron line spacing. A dielectric of approximately 3.0 is achieved using tetra ethyl oxy silicate ("TEOS") as the fill material between adjacent lines. Use of a high density plasma oxide fill at the 1 micron spacing has been found to achieve dielectric values between 2.4 and 2.7.

As the line spacings decrease (e.g., below 0.5 microns), new fill processes and materials are needed to avoid RC coupling and achieve minimal RC delays.

SUMMARY OF THE INVENTION

According to the invention, a void is defined between adjacent wiring lines to minimize RC coupling. The void has a low dielectric value approaching 1.0. The void is space absent solid and liquid material. In various embodiments the space is a vacuum or is filled with gaseous substance having desired dielectric properties.

According to one method of the invention, a hollow silicon dioxide sphere defines the void. The sphere is fabricated to a known inner diameter, wall thickness and outer diameter. Preferably, the wiring line height is a multiple of the line spacing, or the spacing is a multiple of the wiring line height. Spheres of a unit dimension then fill the spacing to achieve one or more rows (or columns) of spheres.

According to one aspect of the method, the spheres are rigid enough to withstand the mechanical processes occurring during semiconductor fabrication.

The spheres are held in place during the semiconductor fabrication processes by a binder. According to another aspect of the method, the spheres and binder withstand elevated temperatures up to a prescribed temperature range. At or above a desired temperature, the binder is baked away leaving the sphere intact and in place.

According to another method of the invention, the adjacent wiring lines are "T-topped" (i.e., viewed cross-sectionally). In a specific embodiment, the cross section appears as a "T" or as an "I." Dielectric fill is deposited in the spacing between lines by a chemical vapor deposition ("CVD") or other deposition process. As the dielectric material accumulates on the wiring line and substrate walls, the T-tops grow toward each other. Eventually, the T-tops meet sealing off an internal void. Using controlled processes, the void is reliably defined to a known size and shape.

According to preferred embodiments, a spacing between adjacent wiring lines of a semiconductor substrate includes a first material which defines a void. The void has no solid material or liquid material, but may include a gas. Also, the void is characterized by a dielectric constant which is lesser than the dielectric constant of the first material. In one embodiment, a plurality of discrete hollow objects fill the spacing. Each one of the plurality of objects is a hollow, rigid, silica sphere which defines a void. Each sphere is of substantially the same dimensions. The spacing between adjacent lines is approximately a first multiple of sphere outer diameter. The height of the adjacent wiring lines is approximately a second multiple of sphere outer diameter. Preferably, either one, but not both, of the first multiple and the second multiple are greater than one.

According to a preferred embodiment of one method, a void is controllably-defined in spacing between adjacent wiring lines of a semiconductor substrate. At one step, a plurality of discrete hollow silica spheres are applied to the spacing. At another step, excess spheres are removed from areas other than the spacing. At another step, material is deposited over the wiring lines and spheres. For one method, the spheres are applied as part of a film, including a binder. The binder holds the objects in place within the spacing. For one method, the excess spheres are removed by performing a chemical-mechanical polishing ("CMP") process. Preferably, the deposition step occurs at a temperature sufficient to break down the binder while leaving the spheres in place and intact.

According to another preferred embodiment, a void is controllably-defining in spacing between adjacent wiring lines of a semiconductor substrate using an alternative method. At one step, a T-top configuration is etched at each of the adjacent wiring lines. At another step, dielectric material is deposited onto the substrate and adjacent wiring lines. The deposited material accumulates about the T-tops to seal off a void in the spacing. The void forms with dimensions determined by the spacing, wiring line height, and undercut of the T-tops. For various alternatives, the wiring line cross-sections after T-topping resemble an "I" or a "T" configuration.

According to one advantage of the invention, the controllably-defined void(s) reduce the dielectric value in the spacing between adjacent wiring lines. As a result, the RC delay is comparatively reduced. According to another advantage, the reduced dielectric is achieved for conventional (e.g.,≧1.0 microns) or reduced line spacings (e.g., <1.0 microns;<0.5 microns). With sphere outer diameters achieved at 0.1 microns, the method has the advantage of being beneficial for line spacing as low as 0.1 microns. As technologies enable smaller spheres, the method also becomes applicable for smaller line spacings. These and other aspects and advantages of the invention will be better understood by reference to the following detailed description taken in conjunction with the accompanying drawings.

DETAILED DESCRIPTION OF THE INVENTION

Overview

Figure 1:
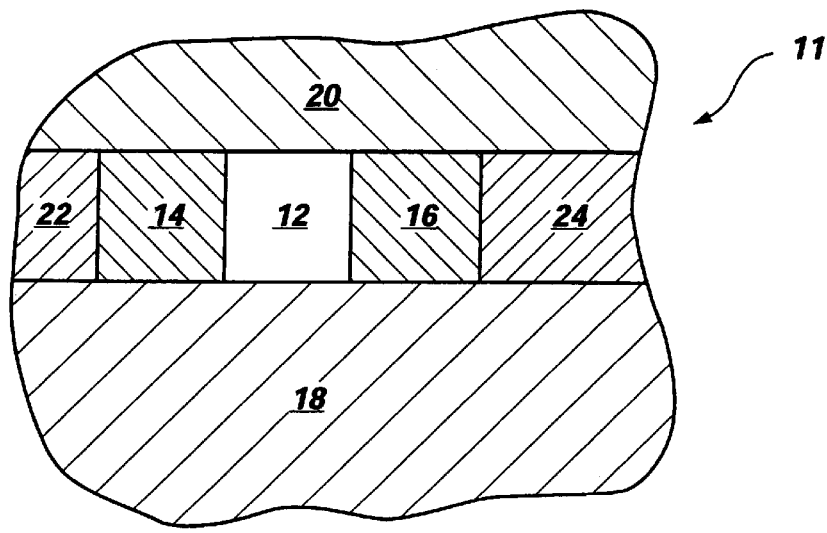
FIG. 1 is a partial cross-sectional view of adjacent wiring lines on a substrate having a controllably-defined void in the line spacing according to an embodiment of this invention.

FIG. 1 shows a partial view of an integrated circuit (IC) 11 having a void 12 formed between adjacent wiring lines 14, 16. The wiring lines 14, 16 are conductively coupled to respective portions of a semiconductor substrate 18. The substrate 18 includes various n-type and p-type doped regions interconnected by wiring lines, such as lines 14, 16. The interconnected substrate regions define desired semiconductor devices. The wiring lines are formed by one or more layers, including a barrier layer and a metal conductive layer. The barrier layer serves to prevent metal penetration into the substrate 18 during the formation processes. The conductive layer couples a local area of the substrate (e.g ., doped or not doped area) to another area (not shown) or another layer 20. The spacing between adjacent wiring lines is occupied by fill material 22, 24 or is a void 12.

Figure 2:
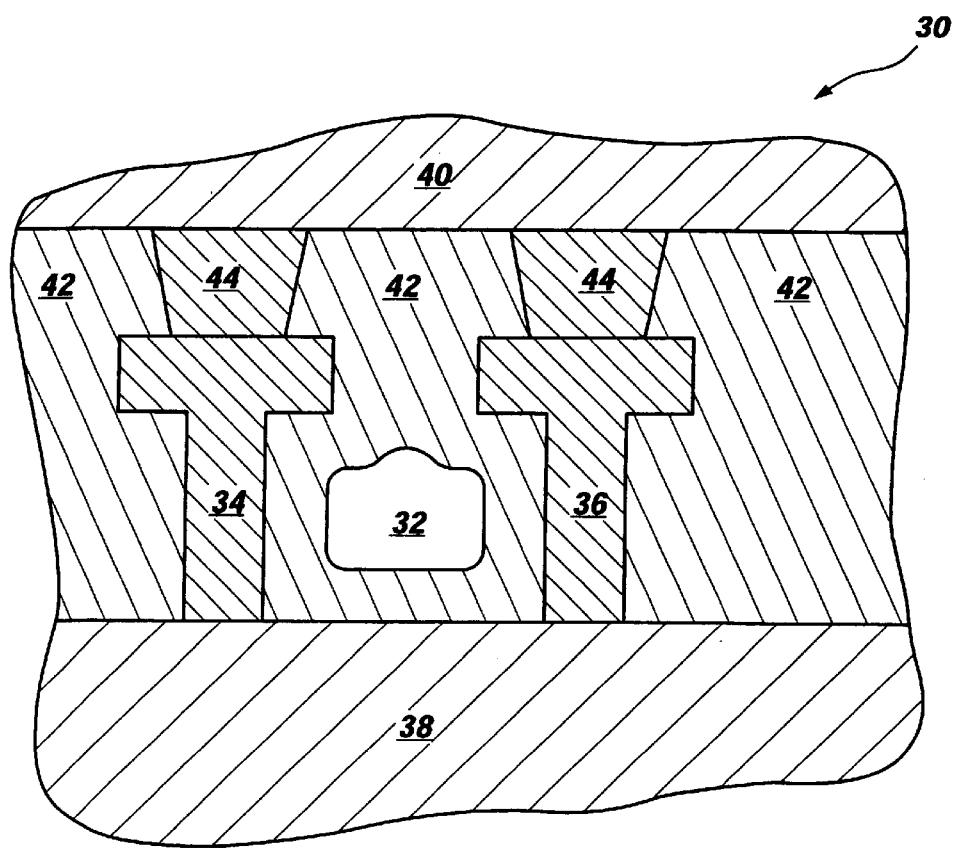
FIG. 2 is a partial cross-sectional view of adjacent wiring lines on a substrate having a controllably-defined void in the line spacing according to another embodiment of this invention.

FIG. 2 shows a partial view of an integrated circuit (IC) 30 having a void 32 formed between adjacent wiring lines 34, 36 according to an alternative embodiment of this invention. The wiring lines 34, 36 are conductively coupled to respective portions of a semiconductor substrate 38. The substrate 38, like substrate 18 includes various n-type and p-type doped regions interconnected by wiring lines. The interconnected substrate regions define desired semiconductor devices. The wiring lines couple a local area of the substrate (e.g., doped or not doped area) to another area (not shown) or layer 40. The spacing between adjacent wiring lines are occupied by fill material 42 and the void 32. In the embodiment shown, vias 44 are formed through the fill material 42 and filled with conductive material to respectively couple the wiring lines 34, 36 to an adjacent layer 40.

For the various IC embodiments, a void 12/32 in the spacing between adjacent wiring lines serves to reduce RC coupling of the lines. RC coupling is reduced by reducing the dielectric constant in the spacing. Specifically, because the dielectric constant of the void (e.g., approximately 1.0) is less than the dielectric constant of conventional fill materials (e.g., approximately 3.0), the dielectric constant in the spacing between lines is reduced.

Following are descriptions of alternative methods for controllably-defining the voids 12, 32.

Void Defined by Hollow Silicon Spheres

Figure 3:
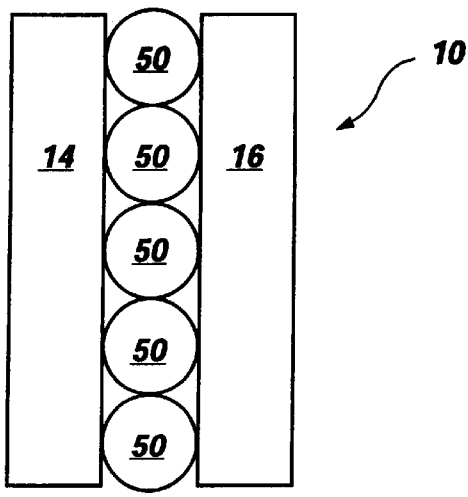
FIG. 3 is block diagram of a row of hollow spheres filling the spacing between adjacent wiring lines according to one embodiment of this invention.
Figure 4:
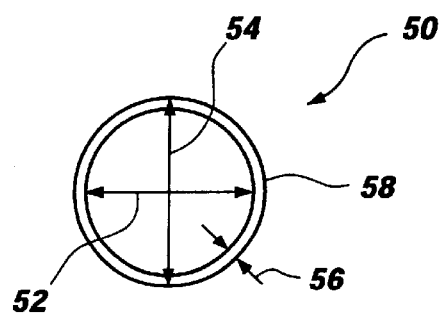
FIG. 4 is a cross sectional view of a sphere of FIG. 3.

Referring to FIG. 3, an integrated circuit 10 having integral devices (not shown) and wiring lines 14, 16 formed by known processes receives hollow spheres 50. As seen in FIG. 4, the spheres 50 have an inner diameter 52, outer diameter 54 and wall thickness 56 of known dimensions. In a preferred embodiment, the sphere walls 58 are formed of silica. For a given embodiment, each sphere 50 has the same dimensions. Preferably, the line height and the line spacing is a multiple of the sphere outer diameter. Alternatively, the sphere outer diameter is slightly less than a value which makes the spacing or height a multiple of the outer diameter. Although the outer diameter of each sphere 50 is substantially the same for a given embodiment, the outer diameter varies for different embodiments. The outer diameter varies among different embodiments from a value greater 1.0 microns to a value less than 0.5 microns. Spheres as small as 0.1 microns in outer diameter are achievable.

The spheres 50 are of sufficient rigidity to withstand the mechanical stresses occurring in fabricating an integrated circuit. In one embodiment, the ratio of outer diameter to wall thickness is approximately 10:1, although greater or lesser ratios are used in other embodiments.

Figure 5:
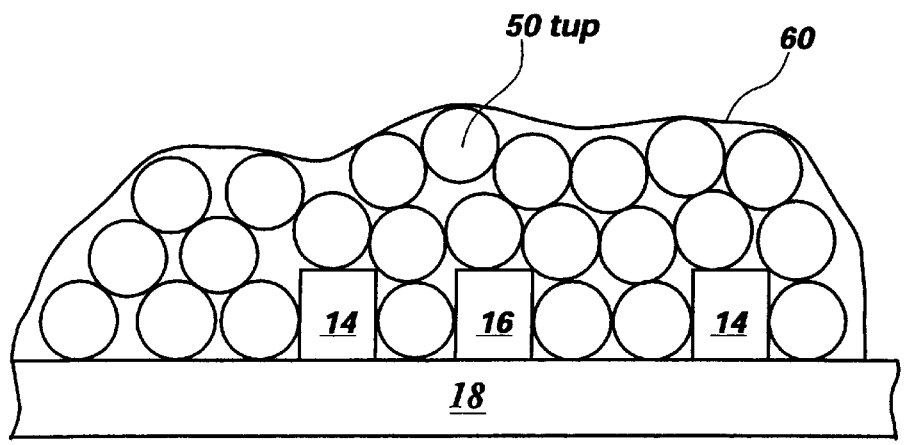
FIG. 5 is a cross-sectional view of a substrate receiving a film of spheres according to a step of one method embodiment of this invention.

At one step, the spheres 50, together with a binder material and/or dispersion chemical, are applied to the substrate 18 using a spinning process or a monolayer formation process. An exemplary binder material is methyl isobutyl ketone ("MIBK"). The function of the binder is to hold the spheres in place relative to the wiring lines 14, 16 and substrate 18. Exemplary dispersion chemicals include polyethylene oxide or a silanol compound. The function of the dispersion chemicals is to disperse the spheres into the line spacings and over the wiring lines and substrate. A film 60, formed by the spheres 50, binder material and/or dispersion chemical accumulates on the substrate 18 and wiring lines 14, 16 as shown in FIG. 5.

Figure 6:
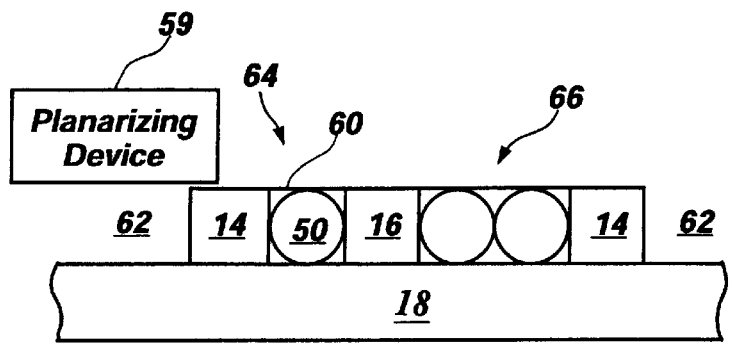
FIG. 6 is a cross-sectional view of a substrate after chemical-mechanical polishing according to a step of one method embodiment of this invention.

At another step, the substrate is planarized. A chemical-mechanical polishing ("CMP") or other planarizing device 59 removes the film 60 from the tops of the wiring lines 14, 16 as shown in FIG. 6. In one embodiment, the wiring lines 14, 16 have a height relative to the substrate 18 surface which is a multiple of the sphere 50 outer diameter 54. For minor variations of height to outer diameter, the wiring lines 14, 16 are planed back to be a multiple of sphere 50 outer diameter 54. For areas 62 not to be filled with the film 60, an etching process is used to remove the film 60 (see FIG. 6).

Figure 7:
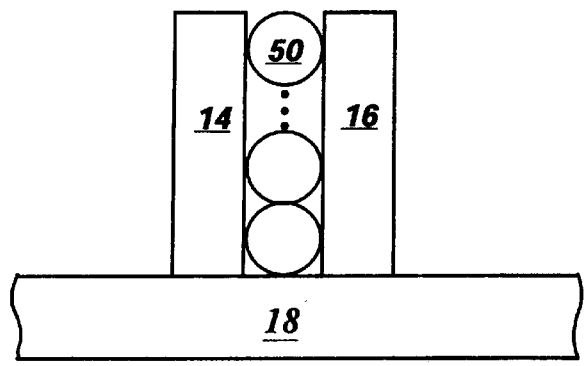
FIG. 7 is a cross-sectional view of a substrate in which wiring line height is a multiple of line spacing.
Figure 8:
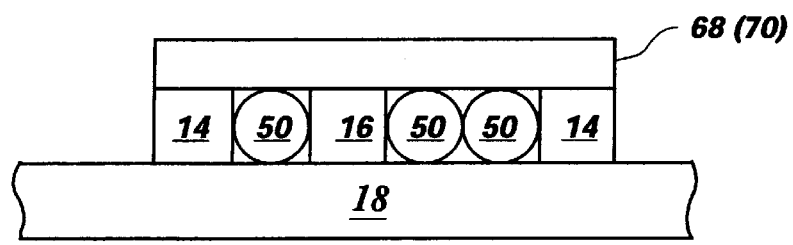
FIG. 8 is a cross-sectional view of a substrate after a layer is deposited over the wiring lines and spheres of FIG. 6 according to a step of one method embodiment of this invention.

FIG. 6 shows two preferred relations between wiring line 14, 16 height and wiring line spacing. In one region 64, the wiring line height equals the wiring line spacing. In another region 66, the wiring line spacing is a multiple (e.g., 2) of the wiring line height. Preferably, the ratio of the longer of the height and spacing to the shorter of height and spacing is an integer, (i.e., either the spacing is a multiple of the height or the height is a multiple of the spacing). FIG. 7 shows the height being a multiple of the spacing. For the best mode of the invention, spheres are applied which have an outer diameter substantially equal to (or slightly smaller than) either one or both of the line height or the line spacing. In other embodiments, either one or both of the height and spacing are multiples of the sphere outer diameter. Preferably, both the line height and line spacing are not a multiple greater than 1 relative to the sphere outer diameter.

In alternative embodiments, either a dielectric or a plasma oxide layer is applied over the wiring lines 14, 16 and spheres 50. For dielectric layer 68, low temperature dielectric reflow is deposited on the wiring lines 14, 16 and spheres 50. Reflow improves filling of high aspect-ratio contacts and via openings. Preferably, the deposition process occurs at a temperature high enough to bake off the binder material, but low enough not to alter the structural integrity of the spheres 50. More specifically, one does not want to collapse or puncture the spheres 50 during the dielectric reflow deposition step. In one embodiment, binder material capable of withstanding temperatures up to a desired temperature (e.g., 200 degrees C.) are used. Above the desired temperature, the binder breaks down and flows out as a vapor, but leaving the spheres in place and intact.

Alternatively, for a plasma oxide layer 70, plasma oxide is deposited over the wiring lines 14, 16 and the spheres 50. Preferably, the process occurs at a temperature sufficient to bake off the binder material, while leaving the spheres in place and intact. Further semiconductor processes then occur to fabricate another device level or area of the substrate 18.

Void Defined by Controlled Deposition

Figure 9:
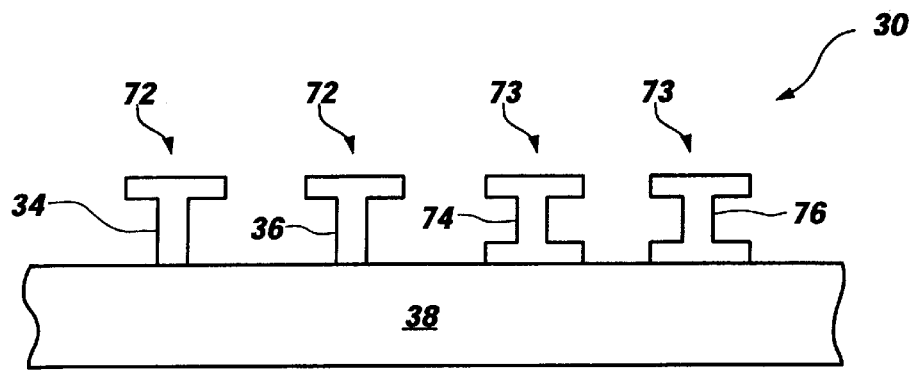
FIG. 9 is a cross-sectional view of a substrate with adjacent "T" shaped and "I" shaped metal wiring line stacks according to an embodiment of this invention.

Referring to FIG. 9, a semiconductor substrate 38 has integral devices (not shown) formed by known processes. Metal stacks 72, 73 are formed to define wiring lines 34, 36, 74, 76. According to alternative embodiments, the stack cross-section appears as a "T" (e.g., stack 72) or an "I" shape (e.g., stack 73). Of significance is the "T-top" in each embodiment. By depositing a dielectric layer, the T-tops of adjacent wiring lines grow toward each other sealing off a void between adjacent wiring lines (see FIG. 2).

Figure 10:
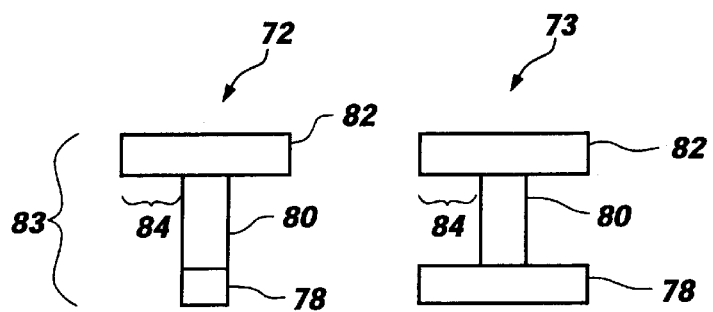
FIG. 10 is a cross-sectional view of a "T" shaped metal wiring stack and an "I" shaped metal wiring stack of FIG. 9.

Referring to FIG. 10, each metal stack includes a barrier layer 78, a conductive layer 80 and a top layer 82. A common material for an exemplary barrier layer 78 is titanium, although other elements and alloys are used, (e.g., titanium nitride, titanium tungsten, tantalum nitride). A common material for an exemplary middle layer 80 is aluminum although other elements and alloys also can be used, (e.g., copper, gold). A common material for an upper layer 82 is titanium nitride, although other materials and alloys are used, (e.g., titanium tungsten, titanium, titanium aluminide, tantalum nitride).

In one embodiment, the three layers are deposited, then etched, using a reactive ion etching (RIE) process to achieve a straight metal stack. For an "I" stack 73, the conductive middle layer 80 is etched using a wet dip process to achieve the "I" configuration. For a "T" stack 72, both the conductive middle layer 80 and the barrier layer 78 are etched using a wet dip process to achieve the T-top configuration. Alternatively, the barrier layer 78 and middle layer 80 are formed to desired shape by an RIE process. An isotropic overetch then is performed to achieve the "T-top" for either the "T" stack 72 or "I" stack 73.

For each stack 72, 73 configuration, the length of undercut 84 is prescribed based upon a desired line resistance, the desired line spacing between adjacent stacks 72 and/or 73 and the size of void desired between adjacent wiring lines 34/36/74/76.

Figure 11:
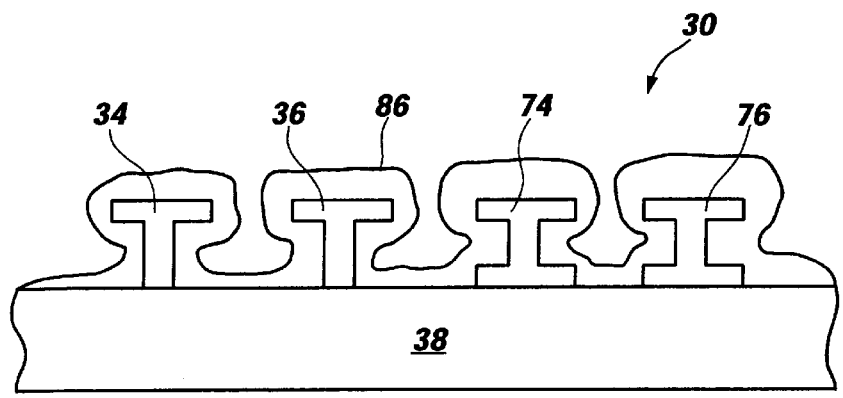
FIG. 11 is a cross-sectional view of the substrate of FIG. 9 during dielectric deposition according to a step of a method embodiment of this invention.

With the stacks formed at desired locations with desired dimensions (e.g., line height, pitch, undercut) and desired line spacings, dielectric material 86 is deposited using a CVD or other deposition process. Exemplary dielectric materials include TEOS, polyamide, $Si_3N_4$, SOG, phosphosilicate glass, and boro-phosphosilicate glass. The dielectric material 86 accumulates on the wiring lines 34, 36, 74, 76 and substrate 38, as shown in FIG. 11. As the deposition process continues, the dielectric material accumulating at adjacent "T-tops" seals off an area between the adjacent lines. Such sealed off area is the desired void 32 (see FIGS. 2 and 12). The deposition process continues for a prescribed time or a prescribed thickness of dielectric material accumulates above the wiring lines 34, 36, 74, 76. Thereafter, the substrate is subjected to a chemical-mechanical polishing process or other planarizing process to achieve a dielectric layer of desired thickness, (see FIG. 13).

For embodiments in which vias 44 (see FIG. 2) are desired, a plasma enhanced chemical vapor deposition of a nitride compound is deposited (e.g., approximately 100 angstroms) prior to dielectric deposition to serve as an etch-stop layer.

Figure 12:
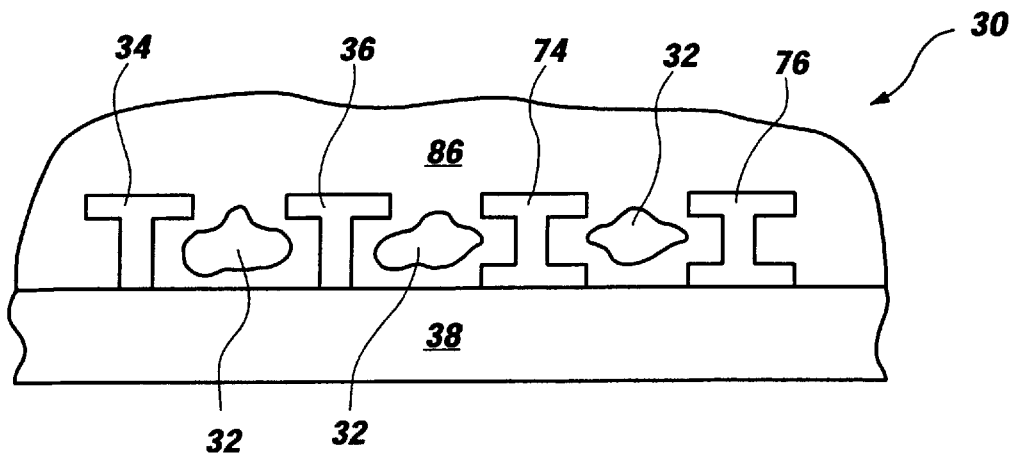
FIG. 12 is a cross-sectional view of the substrate of FIG. 9 after dielectric deposition according to a step of a method embodiment of this invention.
Figure 13:
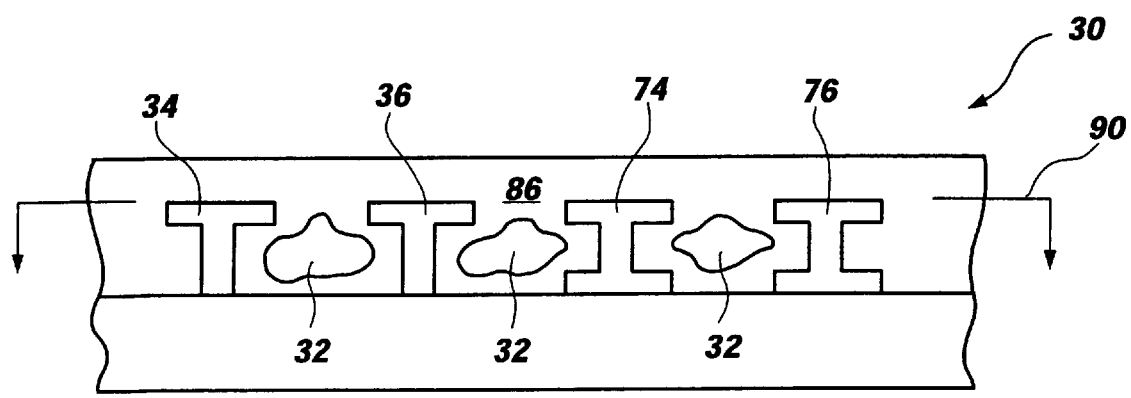
FIG. 13 is a cross-sectional view of the substrate of FIG. 9 after planarizing according to a step of a method embodiment of this invention.

As seen in FIGS. 12 and 13, the formation of the voids 32 is controlled for a given line spacing by (i) appropriately defining the wiring line height 83 and under cut 84 and (ii) controlling the deposition process (see FIG. 10). As a result, the voids 32 occur with known size and shape. Voids 32 formed between adjacent "T" stacks are generally uniform in size and shape. Similarly, voids 32 formed between adjacent "I" stacks are generally uniform in size and shape. The length of each void 32 is determined by the wiring line length of adjacent wiring lines 34, 36, 74, 76.

Figure 14:
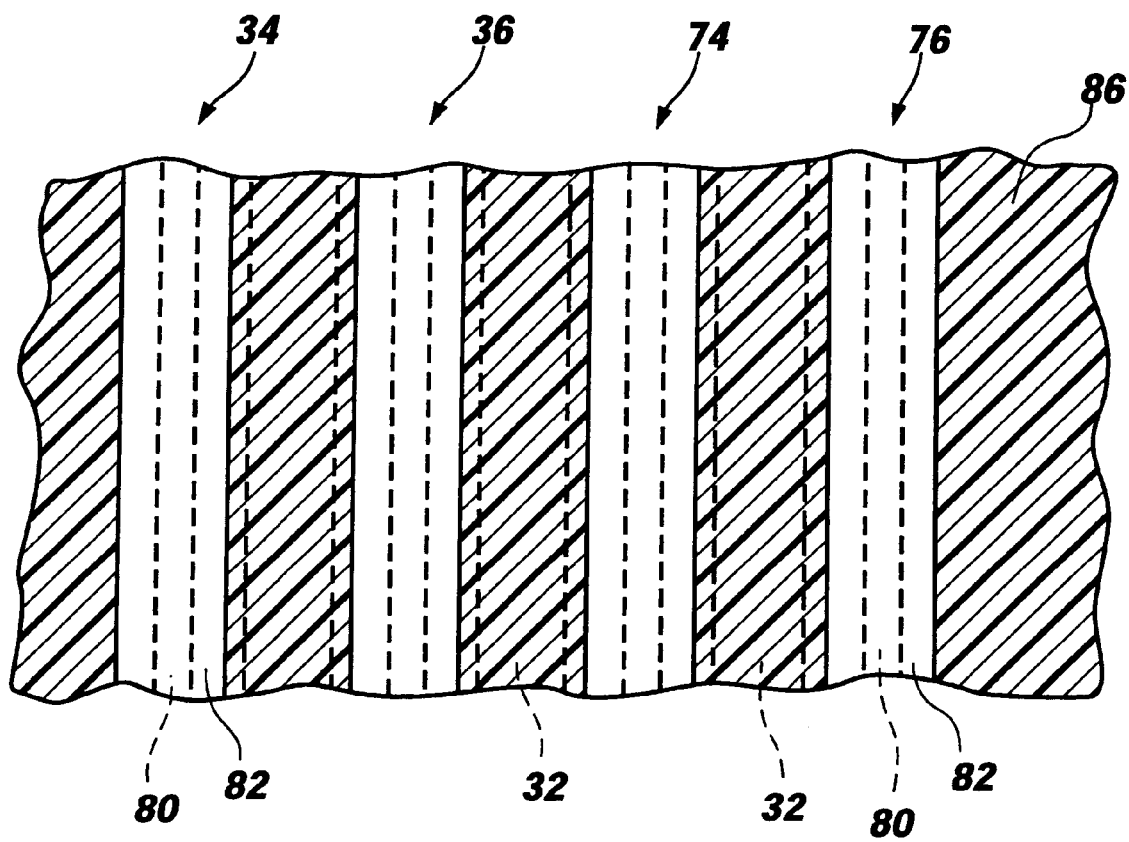
FIG. 14 is a cross-sectional top view along line 90 in FIG. 13, depicting voids between adjacent wiring lines according to the invention.

FIG. 14 depicts a cross-sectional top view along line 90 in FIG. 13, illustrating that the length of each void 32 corresponds with the length of adjacent wiring lines 34, 36, 74 and 76.

The voids 32 have a dielectric constant of approximately 1.0. The surrounding dielectric material 86 has a higher dielectric value (e.g., TEOS has a dielectric constant of 3.0, high density plasma oxides have a dielectric constant of 2.4–2.7). The net effect of the void is to lower the dielectric constant across the line spacing and thereby reduce RC coupling between adjacent lines.

Further semiconductor processes also occur after void formation to fabricate additional devices, levels or other area of the substrate 38.

Meritorious and Advantageous Effects

According to one advantage of the invention, the void in the spacing between adjacent wiring lines reduces RC coupling of the lines. RC coupling is reduced by reducing the dielectric constant in the spacing. Specifically, because the dielectric constant of the void (e.g., approximately 1.0) is less than the dielectric constant of conventional fill materials (e.g., approximately 3.0), the dielectric constant in the spacing between lines is reduced. According to another advantage, the reduced dielectric is achieved for conventional or reduced line spacings.

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A semiconductor substrate having a spacing between at least two adjacent wiring lines, comprising:
   at least two adjacent wiring lines each including a base layer, a middle layer, and a top layer, the base layer and the top layer each having a width greater than a width of the middle layer so that a cross section of each of said at least two adjacent wiring lines exhibits an I-shaped configuration, said I-shaped configuration extending substantially continuous along a longitudinal extent of each of said at least two adjacent wiring lines, wherein said at least two adjacent wiring lines are spaced less than 0.5 microns; and
   a dielectric material layer formed over said at least two adjacent wiring lines and between top layers thereof to define a void therebetween, said void elongated and substantially coextensive with an adjacent extent of said at least two adjacent wiring lines such that said substantially coextensive elongated void is substantially between said middle layers and below a top portion of said top layers of said at least two adjacent wiring lines.

2. The substrate according to claim 1, wherein the void exhibits a dielectric constant which is less than the dielectric constant of the dielectric material layer.

3. The substrate according to claim 1, wherein the base layer comprises a barrier layer.

4. The substrate according to claim 3, wherein the barrier layer comprises at least one of titanium, titanium nitride, titanium tungsten, and tantalum nitride.

5. The substrate according to claim 1, wherein the middle layer is a conductive layer.

6. The substrate according to claim 5, wherein the conductive layer comprises at least one of an aluminum base, a copper base, and a gold base.

7. The substrate according to claim 1, wherein the top layer comprises at least one of a titanium nitride layer, a titanium tungsten layer, a titanium layer, a titanium aluminide layer, and a tantalum nitride layer.

8. The substrate according to claim 1, further comprising at least one via in the dielectric material layer, extending substantially from the top layer of at least one wiring line of the at least two adjacent wiring lines to a higher level of the semiconductor substrate.

9. The substrate according to claim 8, wherein the at least one via is filled with conductive material.

10. The substrate according to claim 8, wherein the higher level of the semiconductor substrate comprises at least one higher wiring line.

11. The substrate according to claim 1, wherein the substrate comprises multiple levels with said at least two adjacent wiring lines in at least one of said multiple levels.

12. A device for reducing a RC delay between at least two adjacent wiring lines, comprising:
    a plurality of wiring lines on a substrate with at least two adjacent wiring lines, each having a cross-section resembling an I-shaped configuration, the I-shaped configuration including a base layer, a middle layer, and a top layer of which the base layer and top layer include a width greater than the middle layer, said I-shaped configuration extending substantially continuous along a longitudinal extent of each of said at least two adjacent wiring lines, wherein said at least two adjacent wiring lines are spaced a distance less than 0.5 microns; and
    a dielectric material enclosing a void in a spacing between said at least two adjacent wiring lines, said void elongated and substantially coextensive with an adjacent extent of said at least two adjacent wiring lines such that said substantially coextensive elongated void is substantially between said middle layers and below a top portion of said top layers of said at least two adjacent wiring lines.

13. The device according to claim 12, wherein the dielectric material is formed as a layer over the substrate and said at least two adjacent wiring lines.

14. The device according to claim 12, wherein the void exhibits a dielectric constant which is less than the dielectric constant of the dielectric material layer.

15. The device according to claim 12, wherein the base layer comprises a barrier layer.

16. The device according to claim 15, wherein the barrier layer comprises at least one of titanium, titanium nitride, titanium tungsten, and tantalum nitride.

17. The device according to claim 12, wherein the middle layer is a conductive layer.

18. The device according to claim 17, wherein the conductive layer comprises at least one of an aluminum base, a copper base, and a gold base.

19. The device according to claim 12, wherein the top layer comprises at least one of a titanium nitride layer, a titanium tungsten layer, a titanium layer, a titanium aluminide layer, and a tantalum nitride layer.

20. The device according to claim 12, further comprising at least one via in the dielectric material, extending substantially from the top layer of at least one wiring line of the at least two adjacent wiring lines to a higher level of the substrate.

21. The device according to claim 20, wherein the at least one via is filled with conductive material.

22. The device according to claim 20, wherein the higher level of the substrate comprises at least one higher wiring line.

23. The device according to claim 12, wherein the substrate comprises multiple levels with said at least two adjacent wiring lines in at least one of said multiple levels.

* * * * *

UNITED STATES PATENT AND TRADEMARK OFFICE
CERTIFICATE OF CORRECTION

PATENT NO. : 6,396,119 B1  Page 1 of 1
APPLICATION NO. : 09/515519
DATED : May 28, 2002
INVENTOR(S) : John H. Givens It is certified that error appears in the above-identified patent and that said Letters Patent is hereby corrected as shown below:

On the title page:
In item (56), References Cited,
 OTHER PUBLICATIONS,
 2$^{nd}$ COLUMN, 9$^{th}$ LINE,        change "Bullet" to --Bulletin--

In the specification:
        COLUMN 4,    LINE 19,    change "like substrate 18" to
                                 --like substrate 18,--

Signed and Sealed this

Twenty-ninth Day of January, 2008

JON W. DUDAS
*Director of the United States Patent and Trademark Office*